United States Patent [19]

Yoneda et al.

[11] 4,430,547

[45] Feb. 7, 1984

[54] CLEANING DEVICE FOR A PLASMA ETCHING SYSTEM

[75] Inventors: Masahiro Yoneda, Itami; Shiro Hine, Minoh; Hiroshi Koyama, Amagasaki, all of Japan

[73] Assignee: Mitsubishi Denki Kabushiki Kaisha, Tokyo, Japan

[21] Appl. No.: 309,098

[22] Filed: Oct. 6, 1981

[30] Foreign Application Priority Data

Oct. 9, 1980 [JP] Japan ................................. 55-141480

[51] Int. Cl.³ .............................................. B23K 9/00
[52] U.S. Cl. ........................ 219/121 PD; 219/121 PG; 219/407; 156/643; 204/210
[58] Field of Search ................... 219/121 PD, 121 PE, 219/121 PF, 121 PG, 407, 484; 204/192 E, 210, 164; 156/643, 646, 164

[56] References Cited

U.S. PATENT DOCUMENTS

| | | | |
|---|---|---|---|
| 3,866,017 | 2/1975 | Keren et al. | 219/407 |
| 4,292,384 | 9/1981 | Straughan et al. | 219/121 PE |

FOREIGN PATENT DOCUMENTS

| | | | |
|---|---|---|---|
| 2617483 | of 0000 | Fed. Rep. of Germany . | |
| 55-99726 | 7/1980 | Japan | 156/643 |
| WO80/01363 | 7/1980 | PCT Int'l Appl. | 156/643 |

OTHER PUBLICATIONS

IBM Technical Bulletin, vol. 22, No. 9, 2—1980.
Solid State Technology, May 1976, vol. 19, H.5, S. 31–36.
Solid State Technology, Dec. 1975, Bd. 18, H. 12, S. 25–33.
Solid State Technology, Apr. 1980, S. 157–158.
Solid State Technology, Apr. 1979, S. 139–142.

*Primary Examiner*—M. H. Paschall
*Attorney, Agent, or Firm*—Oblon, Fisher, Spivak, McClelland & Maier

[57] ABSTRACT

A cleaning apparatus for a plasma etching system for etching a sample which includes a chamber having an inlet and an outlet, a sample table positioned in the chamber and which further includes a first electrode, a counter electrode positioned in the chamber opposite the first electrode and a plurality of heating mechanisms positioned in the inlet and outlet of the chamber, in the counter electrode and in the sample table for desorbing a reaction product adsorbed on surfaces of the inlet and outlet of the chamber, the counter electrode and the sample table prior to plasma etching of the sample.

6 Claims, 2 Drawing Figures

CLEANING DEVICE FOR A PLASMA ETCHING SYSTEM

BACKGROUND OF THE INVENTION

1. Field of the Invention

The present invention relates to a cleaning device for a plasma etching system for plasma etching a sample such as a semiconductor substrate.

2. Description of the Prior Art

In a conventional parallel plate electrode type plasma etching apparatus as shown in FIG. 1, a chamber (1) contains an upper electrode (2) facing to a lower electrode (3) having a sample table equipped with a water cooling pipe (4) and the chamber (1) is evacuated in a vacuum of about $10^{-4}$ to $10^{-5}$ Torr. Then, an etching gas such as $CF_4+O_2$ is fed through an inlet (5) to maintain to a predetermined pressure and a high frequency electric power is fed from a power source (6) between the electrodes (2), (3) to form a plasma gas whereby a surface of a sample (7) such as a semiconductor substrate placed on the lower electrode (3) is etched. In the conventional plasma etching apparatus, a reaction product formed by the etching is adhered to an inner wall of the chamber (1). If the etching is repeated under such condition, the evacuation effect is reduced by the adhered reaction product to deteriorate the reproducibility and the sample (7) is disadvantageously stained by the reaction product.

SUMMARY OF THE INVENTION

It is an object of the present invention to provide a plasma etching apparatus having a chamber in which a predetermined condition can be maintained for a relatively long time by repeating operations.

The foregoing and other objects of the present invention have been attained by providing a cleaning device for a plasma etching system comprising a chamber, a plurality of electrodes and a sample table kept in the chamber to perform a plasma etching of a sample such as a semiconductor substrate placed on the sample table and each heating mechanism for heating the chamber, each of the electrodes and the sample table to desorb a reaction product adsorbed on them.

BRIEF DESCRIPTION OF THE INVENTION

FIG. 1 is a sectional view of a schematic structure of a conventional plasma etching apparatus; and FIG. 2 is a sectional view of one embodiment of the plasma etching apparatus according to the present invention.

DETAILED DESCRIPTION OF THE PREFERRED EMBODIMENT

Figure 2:
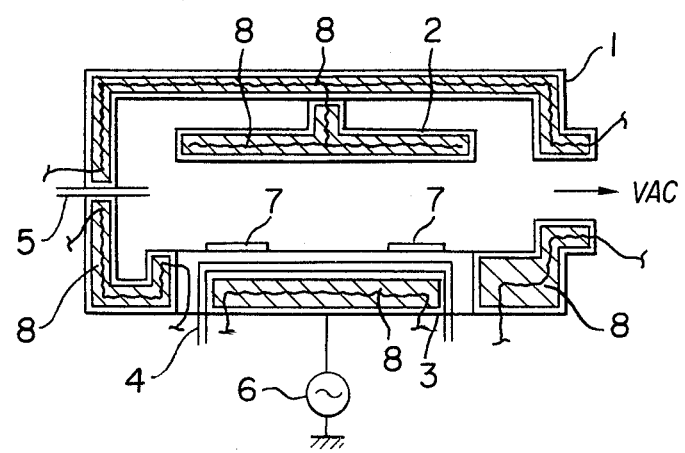

Referring to FIG. 2, one embodiment of the plasma etching apparatus of the present invention will be illustrated.

Figure 1:
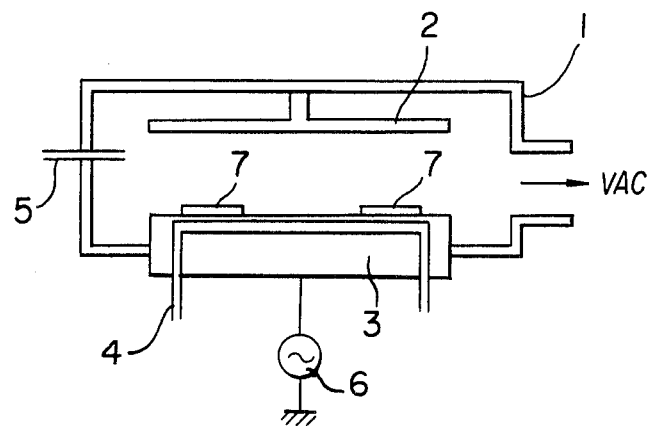

In FIG. 2, the same references designate the identical or corresponding parts shown in FIG. 1. In the embodiment, a plurality of heating mechanism (8) are placed in the chamber (1), the upper electrode (2) and the lower electrode (3) as the sample table.

The operation of the embodiment of the present invention will be illustrated.

The chamber (1), the upper electrode (2) and the lower electrode (3) as the sample table are heated by the heating mechanisms for the sample (7) and the chamber (1) is evacuated whereby the reaction product adsorbed on these parts is desorbed to be eliminated and the cleaning effect is attained. When high frequency electric power is applied between the electrodes (2), (3) by feeding oxygen gas in the chamber (1) under heating to form the plasma, the cleaning effect is further improved. After performing the cleaning operation, the heating operation is stopped and the lower electrode (3) is cooled by the water cooling pipe (4) to a predetermined temperature. Then, the sample (7) (for example, placed in a pre-vacuum chamber) is shifted on the lower electrode (3) and etching is performed under the conventional conditions whereby the disadvantages caused by the conventional apparatus can be overcome.

In the embodiment of the present invention, it is not necessary to repeat the etching and the cleaning. It is possible to perform the cleaning after depositing the reaction product in a degree for the requirement of elimination.

The heating mechanism can be an embedded heater or a hollow jacket in which a heating material such as hot ethyleneglycol is kept. The heating temperature is preferably up to 150° C.

The high frequency electric power applied between electrodes can be a conventional frequency such as 13.56 MHz, 4000 KHz and 380 KHz.

The temperature in cooling is preferably in a range to 10° to 35° C. The electric power applied is preferably in a range of 0.1 to 1.0 watt/cm$^2$.

As described, in accordance with the present invention, the heating mechanisms are equipped within the chamber, the upper electrode and the lower electrode serving as the sample table to perform the cleaning for eliminating the reaction product adhered on the parts before the etching. Therefore, the reproducibility of etching of the sample can be improved. Moreover, in the etching of a semiconductor substrate, the stain caused by the reaction product is effectively prevented. The structure of the apparatus is simple in construction and allows for attainment of the plasma etching of the sample.

The heating mechanism is preferably embedded in each of the walls of the chamber, the surface plates of the upper electrode and the surface of the lower electrode. The water cooling pipe is preferably placed above the heating mechanism in the lower electrode as the sample table. The heating mechanism can be of an electric resistance type which is electrically heated and the wall itself can be the electric resistance member, though the wall itself is preferably a corrosion resistant plate. The temperature for heating the heating mechanism is preferably selected depending upon the temperature for plasma etching resulting from the high frequency electric power. The heating mechanism should be embedded at least at a predetermined part for preventing deposition of the reaction product, especially the inlet and outlet for the plasma gas and the sample table.

What is claimed is:

1. A cleaning apparatus for a plasma etching system for etching a sample, comprising:
    a chamber having an inlet and an outlet;
    a sample table positioned in said chamber and which further comprises a first electrode;
    a counter electrode positioned in said chamber opposite said first electrode; and
    a plurality of heating mechanisms respectively positioned in said inlet and said outlet of said chamber, in said counter electrode and in said sample table for desorbing a reaction product adsorbed on surfaces of said inlet and outlet of said chamber, said counter electrode and said sample table prior to plasma etching of said sample.

2. The apparatus according to claim 1, further comprising a cooling table wherein at least one of said heating mechanisms is embedded in said sample table below said cooling table.

3. The apparatus according to claim 1 wherein said heating mechanisms further comprise electric resistance heaters.

4. The apparatus according to claim 1, wherein said heating mechanisms are embedded in wall portions of said chamber.

5. The apparatus according to claim 1 further comprising means for feeding oxygen gas to said chamber during heating operation of said heating mechanisms.

6. The apparatus according to claim 1 further comprising means operatively associated with said sample table for cooling said sample table after heating operation of said heating mechanisms.

* * * * *